United States Patent [19]

Shimoji

[11] Patent Number: 5,343,423
[45] Date of Patent: Aug. 30, 1994

[54] FET MEMORY DEVICE

[75] Inventor: Noriyuki Shimoji, Kyoto, Japan

[73] Assignee: Rohm Co., Ltd., Kyoto, Japan

[21] Appl. No.: 813,136

[22] Filed: Dec. 23, 1991

[30] Foreign Application Priority Data

May 29, 1991 [JP] Japan .................. 3-155821

[51] Int. Cl.⁵ .................. G11C 11/34; G11C 7/00
[52] U.S. Cl. .................. 365/182; 365/185; 365/218
[58] Field of Search .................. 257/314, 315, 374, 390, 257/395, 396, 397, 510, 513, 514, 515, 622; 365/185, 182, 218

[56] References Cited

U.S. PATENT DOCUMENTS

| | | | |
|---|---|---|---|
| 4,375,087 | 2/1983 | Wanlass | 365/185 |
| 4,763,177 | 8/1988 | Paterson | 365/185 X |
| 4,797,804 | 1/1989 | Rockett, Jr. | 365/154 |
| 4,996,668 | 2/1991 | Paterson et al. | 365/185 |
| 5,051,795 | 9/1991 | Gill et al. | 357/23.5 |

FOREIGN PATENT DOCUMENTS

| | | | |
|---|---|---|---|
| 0120171 | 9/1980 | Japan | 365/185 |
| 59-211281 | 11/1984 | Japan | . |
| 62-45182 | 2/1987 | Japan | . |

*Primary Examiner*—Eugene R. LaRoche
*Assistant Examiner*—Son Dinh
*Attorney, Agent, or Firm*—Brumbaugh, Graves, Donohue & Raymond

[57] ABSTRACT

A plurality of trap-type memory transistors are formed in separate wells of a semiconductor substrate, and arranged to constitute a memory matrix. Each well contains the memory transistors belonging to one column of the memory matrix. Each of gate control lines is connected to gate electrodes of the memory transistors belonging to the same row of the memory matrix. One of the memory transistors is selected for writing by separately applying control voltages to the respective wells from an X-decoder, and separately applying control voltages to the respective gate control lines from an Y-decoder. The well and gate control line associated with the memory transistor to be selected are supplied with different voltages than those for the remaining wells and gate control lines.

5 Claims, 4 Drawing Sheets

FET MEMORY DEVICE

BACKGROUND OF THE INVENTION

The present invention relates to an FET (field effect transistor) memory device in which a plurality of trap-type (e.g., MNOS or MONOS-type) nonvolatile memories are arranged in matrix form.

In conventional memory devices of this type, a substrate (well) is common to all memory cells. Therefore, simply selecting the gate of a certain memory transistor will cause the other memory transistors connected to the same line to be selected as well. To avoid this, a write-inhibition voltage is applied to bit lines of memory transistors not to be selected. Further, in order to prevent a current leakage from the bit lines, transistors for cell selection are provided in addition to the memory transistors.

FIGS. 5 and 6 are circuit diagrams showing conventional memory devices of the above type. The device of FIG. 5 is disclosed in Japanese Patent Application Unexamined Publication No. Sho. 62-45182, and the device of FIG. 6 in Japanese Patent Application Unexamined Publication No. Sho. 59-211281. In FIG. 5, reference numeral 30 designates a well which is common to all memory cells M1, M2, M3, M4, etc. Each memory cell has a transistor $Q_s$ for cell selection besides a memory transistor $Q_m$. Also in FIG. 6, as can be understood from the fact that portions 31, 32 of each of memory cells M1–M3 are connected to each other, a single common well is employed in this device. Each memory cell includes a memory transistor 33 and a transistor 34 for cell selection.

As described above, since in conventional matrix-type memory devices each memory cell requires a transistor for cell selection besides a memory transistor, its size is increased as much, which results in a large-sized memory device. Further, additional wiring for and control voltage application to the transistors for cell selection make the construction of the memory device more complicated.

SUMMARY OF THE INVENTION

The present invention has been made in view of the above problems in the art. Accordingly, an object of the invention to provide an FET memory device having a simple structure which does not need transistors for cell selection.

According to the invention, a memory device comprises:
a semiconductor substrate;
a plurality of wells formed in the substrate so as to be electrically isolated from each other;
a plurality of memory cells arranged in the wells to constitute a memory matrix having rows and columns, and having respective control electrodes;
a plurality of control lines connected to the respective control electrodes;
first voltage application means for applying first voltages to the respective wells; and
second voltage application means for applying second voltages to the respective control lines;
wherein the memory cells are selectively rendered in a writing state or an erasing state by controlling the first and second voltages.

DESCRIPTION OF THE PREFERRED EMBODIMENT

Figure 1:
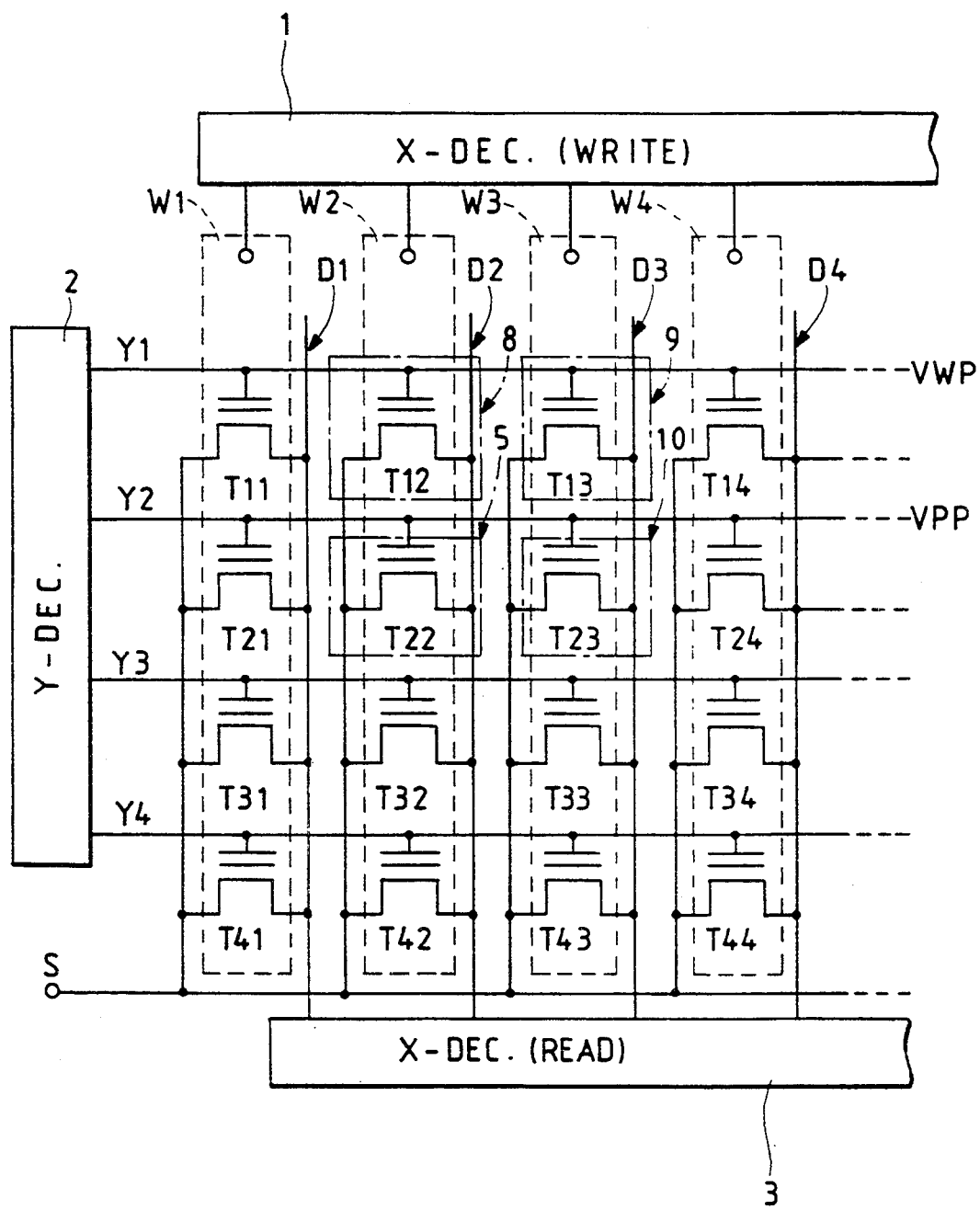
FIG. 1 is a circuit diagram showing an FET memory device according to an embodiment of the present invention.

FIG. 1 shows an FET memory device according to an embodiment of the present invention. Reference characters W1–W4 designate wells which are separated from one another in a semiconductor substrate. Memory cells have respective memory transistors T11–T44, but do not include transistors for cell selection as required in the conventional memory devices described above. Each of the wells W1–W4 has memory transistors arranged in the Y-direction. Y1–Y4 represent gate control lines each shared by the gate electrodes of memory transistors arranged in the X-direction and belonging to the respective wells W1–W4. Reference numeral 1 designates a writing X-decoder which supplies voltages separately to the respective wells W1–W4 during the writing, and numeral 2 a Y-decoder which supplies voltages separately to the respective gate control lines Y1–Y4 during the writing and reading. Numeral 3 designates a reading X-decoder which supplies voltages separately to the respective wells W1–W4 during the reading. Reference characters D1–D4 designate wiring lines for the drains. Character S represents a wiring line for the sources, which is a common line connected to all the memory transistors. In this manner, according to the present embodiment, the gate control lines Y1–Y4 and the wells W1–W4 are arranged in an orthogonal manner to form a matrix-type memory device.

Figure 2:
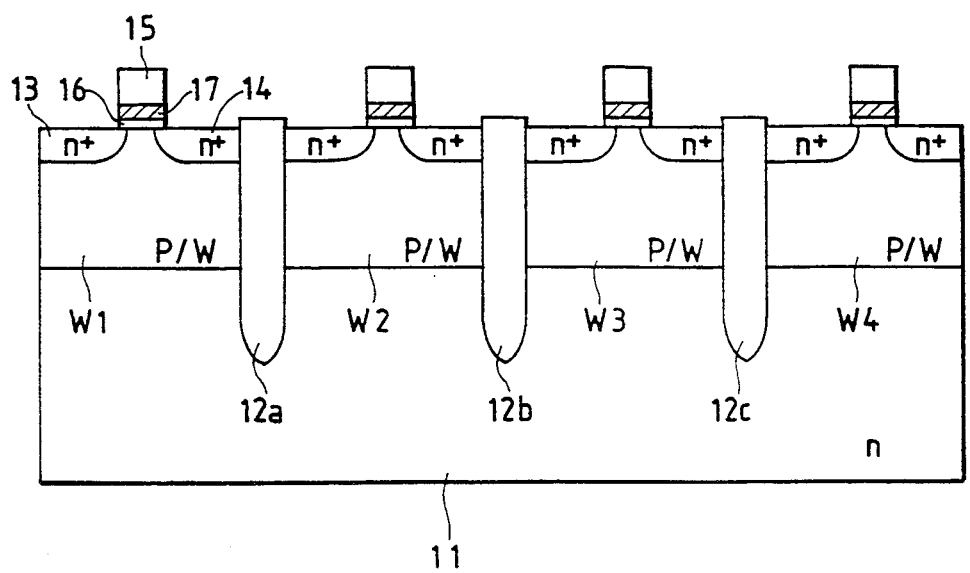
FIGS. 2 and 3 are sectional views showing examples of structures in which a plurality of wells are formed in a semiconductor substrate.
Figure 3:
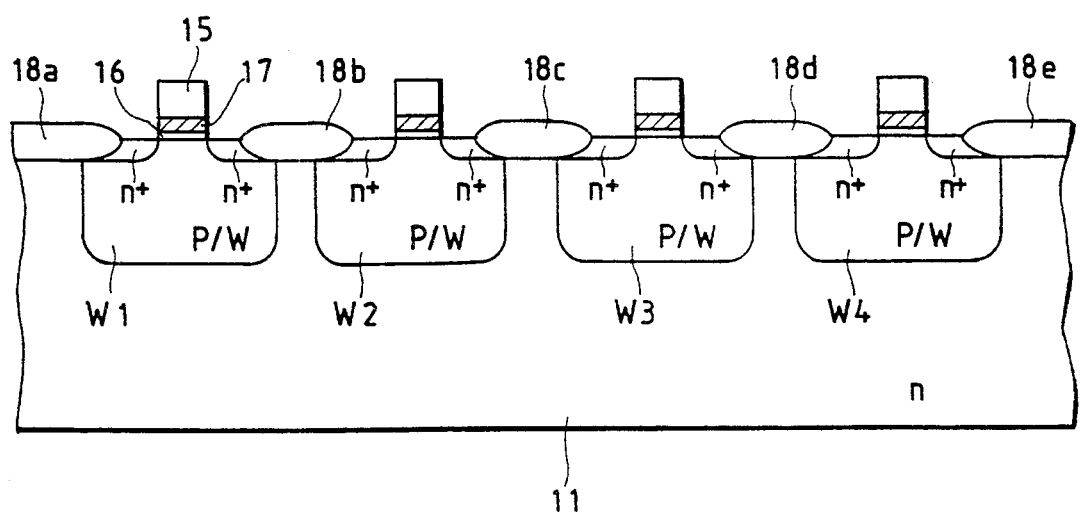

FIGS. 2 and 3 show examples of structures for separating the wells W1–W4 from one another. In FIG. 2, p-type well layers formed on the upper portion of an n-type semiconductor substrate 11 are separated by trenches 12a–12c in the form of oxide layers. Reference numeral 13 designates a source region formed in the well layer; 14, a drain region; 15, a gate electrode; 16, an oxide layer of $SiO_2$; and 17, a nitride layer of SiN.

In FIG. 3, instead of using the trenches 12a–12c in the example of FIG. 2, the wells W1–W4 are separated from one another by reversely biasing p-n junctions formed between an n-type substrate 11 and the respective p-type wells W1–W4 independently formed in the substrate 11. Field oxide layers 18a–18e are formed in the top portions of the substrate 11 in the manner as shown. The remaining portions are the same as in the example of FIG. 2.

Figure 4:
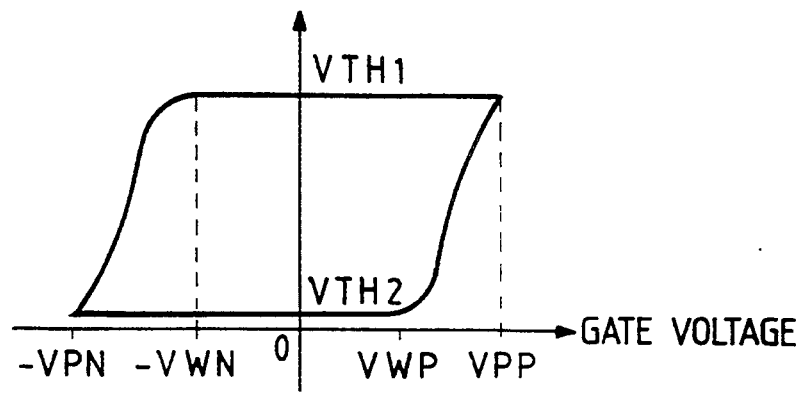
FIG. 4 is a graph illustrative of control voltages to be applied to the gates of memory transistors and wells.
Figure 5:
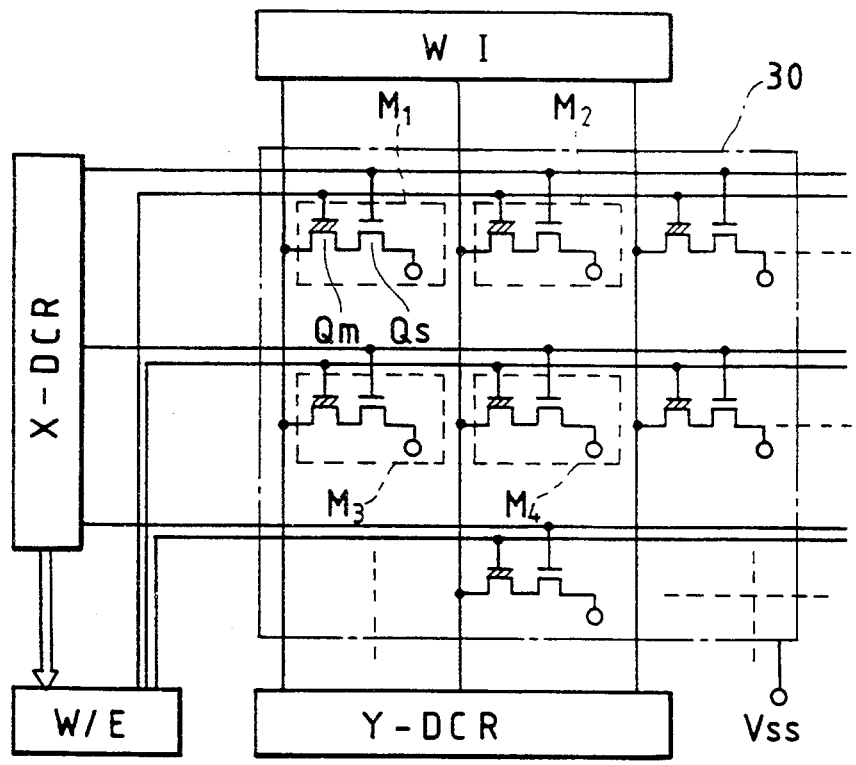
FIGS. 5 and 6 are circuit diagrams showing conventional FET memory devices.
Figure 6:
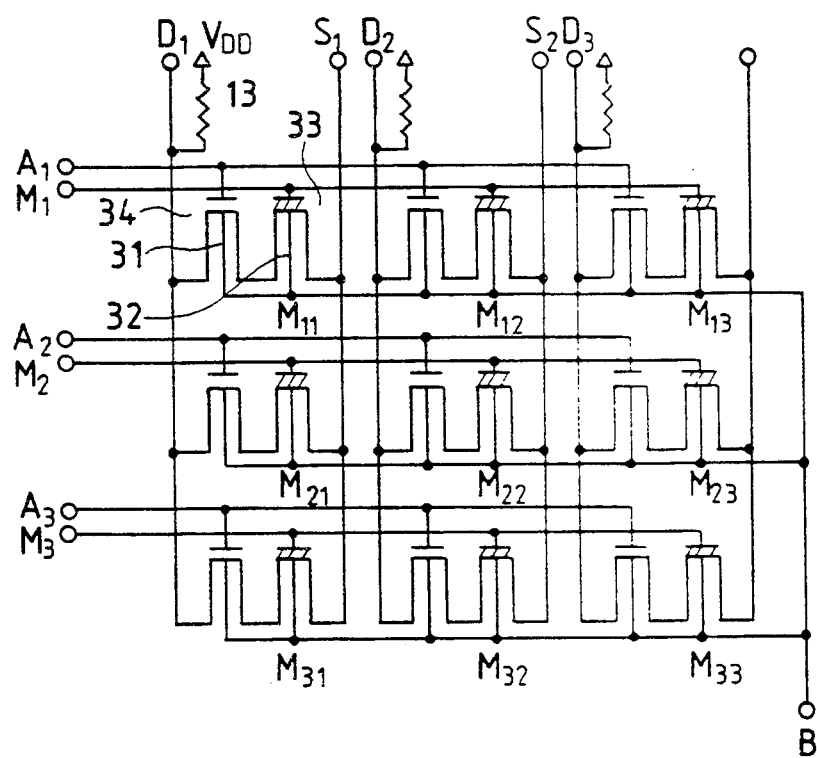

Next, referring to FIG. 4, a description is made as to how, during the writing, control voltages are applied to the respective memory transistors T11–T44 of the memory device of FIG. 1, with an assumption that writing is performed on a memory cell 5. The ground potential (or a low voltage) is applied to the well W2, while a programming voltage VPP as shown in FIG. 4 is applied to the gate control line Y2. As a result, a high electric field develops between the gate electrode of the memory transistor T22 of the memory cell 5 and the well W2, whereby electrons are injected from the substrate 11 into the nitride layer 17 and trapped therein. This completes the writing on the memory cell 5.

The gate electrode of, e.g., the memory transistor T12 of a memory cell 8 not to be selected which shares the well W2 with the memory cell 5 is supplied with a voltage VWP as shown in FIG. 4 via the gate control line Y1. The voltage VWP is the maximum of the voltage range in which writing is not caused. (A voltage slightly lower than VWP may be used.) The voltage VWP does not generate, between the gate electrode of the memory transistor T12 of the memory cell 8 and the well W2, an electric field strong enough to cause electron injection into the nitride layer 17. Therefore, electron trapping does occur, and no storage is effected.

In the case of a memory cell 10 not to be selected which does not share a well with the selected memory cell 5 but shares the gate control line Y2 therewith, the well W3 is supplied with a voltage X which satisfies the relationship $(VPP-X) \times VWP$, that is, $X \leq (VPP-VWP)$, where $(VPP-X)$ is the potential difference between the gate electrode of the memory transistor T23 and the well W3.

As a result of the above control voltage application method, in memory cells not to be selected such as a memory cell 9 which shares neither a well or a gate control line with the memory cell 5 to be selected, a potential difference $\{VWP-(VPP-VWP)\}=(2VWP-VPP)$ will develop between the gate electrode and the well. If this value is in the range between $-VWN$ and $VWP$, then no malfunction occurs in either the writing or erasing. According to FIG. 4, $(2VWP-VPP)$ is almost 0 V. In the above-described writing operation, it is not necessary to supply any voltage to the source region or drain region of the memory transistor of each memory cell, that is, those regions can be left open.

Although the foregoing description is mainly related to the writing operation, the complete selection of a memory cell can be realized in the erasing operation too by applying proper control voltages to the gate control lines and wells in the similar manner.

As described in the foregoing, according to the invention, since the selection is made from among the matrix-type memory cells which are accompanied by the corresponding matrix of the gate control lines and wells, the writing and erasing operations can be executed on each memory cell. Further, since no transistors for cell selection are required, the size of each memory call can be reduced and the number of wiring lines can be reduced. Having such advantages, the present invention is very useful.

What is claimed is:

1. A memory device comprising:
   a semiconductor substrate;
   a plurality of wells formed in the substrate so as to be electrically isolated from each other;
   a plurality of memory cells arranged in the wells to constitute a memory matrix having rows and columns, and having respective control electrodes;
   a plurality of control lines connected to the respective control electrodes;
   first voltage application means for applying controllable first voltages to the respective wells; and
   second voltage application means for applying controllable second voltages to the respective control lines;
   the first voltage application means and the second voltage application means being arranged to produce a potential difference between the well and the control electrode of a memory cell which is sufficient to write or erase data therein wherein source or drain regions associated with the memory cell are allowed to float,
   wherein the memory cells are selectively rendered in a writing state or an erasing state by controlling the first and second voltages.

2. The memory device of claim 1, further comprising third voltage application means for applying third voltages to the respective wells, wherein the memory cells are selectively subjected to reading by controlling the second and third voltages.

3. An FET memory device comprising:
   a semiconductor substrate;
   a plurality of wells formed in the substrate so as to be electrically isolated from each other;
   a plurality of memory transistors arranged in the wells to constitute a memory matrix, each of the wells containing part of the memory transistors belonging to one column of the memory matrix;
   a plurality of gate control lines each connected to gate electrodes of part of the memory transistors belonging to a same row of the memory matrix;
   first voltage application means for applying first voltages to the respective wells; and
   second voltage application means for applying second voltages to the respective gate control lines;
   the first voltage application means and the second voltage application means being arranged to produce a potential difference between the well and the gate electrode of a memory transistor which is sufficient to write or erase data therein wherein source or drain regions associated with the memory transistor are allowed to float,
   wherein one of the memory transistors is selected for writing or erasing by applying different values of the first voltages to a first well containing the memory transistor to be selected and to the wells other than the first well, and applying different values of the second voltages to a first gate control line connected to the gate of the memory transistor to be selected and to the gate control lines other than the first gate control line.

4. The FET memory device of claim 3, further comprising third voltage application means for applying third voltages to the respective wells, wherein one of the memory transistors is selected by applying different values of the third voltages to a second well containing the memory transistor to be selected for reading and to the wells other than the second well, and applying different values of the second voltages to a second gate control line connected to the gate of the memory transistor to be selected and to the gate control lines other than the second gate control line.

5. The FET memory device of claim 3, wherein, in a writing operation, a ground potential or a low voltage is applied to the first well, a programming voltage VPP is applied to the first gate control line, a high voltage VWP within a range of prohibiting writing is applied to the gate control lines other than the first gate control line, and a voltage of (VPP−VWP) or more is applied to the wells other than the first well.

* * * * *

UNITED STATES PATENT AND TRADEMARK OFFICE
CERTIFICATE OF CORRECTION

PATENT NO. : 5,343,423
DATED : August 30, 1994
INVENTOR(S) : Noriyuki Shimoji

It is certified that error appears in the above-identified patent and that said Letters Patent is hereby corrected as shown below:

<u>Column 3, line 22</u>: The formula "(VPP-X)xVWP" should read --(VPP - X) $\leq$ VWP--; <u>line 23</u>: The formula "X$\leq$(VPP-VWP)" should read --X $\geq$ (VPP - VWP)--.

Signed and Sealed this

Twenty-second Day of November, 1994

Attest:

BRUCE LEHMAN

*Attesting Officer*  *Commissioner of Patents and Trademarks*